United States Patent [19]

Neoh

[11] Patent Number: 5,429,912
[45] Date of Patent: Jul. 4, 1995

[54] METHOD OF DISPENSING FLUID ONTO A WAFER

[75] Inventor: Soon E. Neoh, Singapore, Singapore

[73] Assignee: Chartered Semiconductor Manufacturing PTE Ltd., Singapore, Singapore

[21] Appl. No.: 100,308

[22] Filed: Aug. 2, 1993

[51] Int. Cl.$^6$ .................................................. G03C 5/00
[52] U.S. Cl. ...................................... 430/325; 430/326; 118/320
[58] Field of Search .................. 430/325, 326; 118/320

[56] References Cited

U.S. PATENT DOCUMENTS

| | | | |
|---|---|---|---|
| 3,953,265 | 4/1976 | Hood | 430/30 |
| 4,124,411 | 11/1978 | Meuleman et al. | 136/89 |
| 4,827,867 | 5/1989 | Takei et al. | 118/64 |
| 4,889,069 | 12/1989 | Kawakami | 118/50 |
| 4,922,277 | 5/1990 | Carlson et al. | 134/113 |
| 5,252,137 | 10/1993 | Tateyama et al. | 134/34 |

*Primary Examiner*—Marion E. McCamish
*Assistant Examiner*—Laura Weiner
*Attorney, Agent, or Firm*—George O. Saile; Wolmar J. Stoffel

[57] ABSTRACT

A method for dispensing fluids on a semiconductor wafer wherein a wafer is mounted on a rotatable chunk, a fluid to be dispensed is introduced into a well through an inlet located adjacent the bottom of the well, rotating the chunk and moving a soft impact dispensing nozzle, that draws bubble-free fluid from the bottom of the well, over the wafer, and dispensing the fluid at a low pressure and a short distance to the wafer surface.

8 Claims, 4 Drawing Sheets

METHOD OF DISPENSING FLUID ONTO A WAFER

BACKGROUND OF THE INVENTION

1. Field of the Invention

The present invention relates to a coating apparatus for applying a liquid to a semiconductor wafer, and more particularly to a spin coating apparatus for applying a thin uniform thickness coating of a photoresist or developer to a semiconductor wafer.

2. Description of the Related Art

As the degree of miniaturization of semiconductor devices increases, the control of the thicknesses of photoresists, developer, etc. becomes increasing critical. Also the prevention of the formation of bubbles is critical. It is conventional to apply coatings on wafers by spraying the liquid resist or developer over a wafer mounted on a spindle as it is rotated. A typical prior art apparatus is illustrated in FIG. 1. A wafer 10 is shown mounted on a rotation spindle 12 as developer solution 14 or other liquid is dropped or sprayed on the wafer from nozzle 16. Line 18 supplies the liquid to the nozzle 16. The temperature of the liquid can be controlled by a suitable heat exchange apparatus, not shown, which maintains the liquid at a uniform desirable temperature to achieve a desired viscosity.

Current design in semiconductor manufacture normally has a nozzle located at an extreme height, which results in a relatively high impact of the liquid onto the product wafer. This results in poor critical dimensions of the coating geometries across the wafer. Also bubble formation, due to the alkaline nature of the developer liquid, is very dominant, and can also cause an impact on the developer uniformity performance. Even if the nozzle is simply moved near to the surface of the substrate or wafer, the problems are not solved due to the high pressure of impact of the solution onto the wafer. The pressure of the development fluid onto the wafer can be as high as 6 psi., because of the needed pressure to dispense the fluid. FIG. 4 shows the effect of the prior art process at curve 80 in the plot of Critical Dimension (CD) versus wafer radius after the development process. It shows the greater development of the photoresist at the center of the wafer than at the sides of the wafer. This is also better understood with reference to FIG. 5 wherein the result of this over development at the center, using a typical 1.0 micrometer feature size results in photoresist mask of the desired 1.0 micrometer lines 84 at the edges of the wafer 10 and the undesired (too narrow) 0.8 micrometer lines at the center of the wafer. It is seen that curve 82, which is the result of the present new apparatus and method as described below would produce uniform mask dimensions across the wafer.

SUMMARY OF THE INVENTION

An object of the present invention is to provide an improved spin coating apparatus for use in the semiconductor fabrication industry that will lay down a coating layer that is more uniform in thickness and substantially free from bubbles.

Another object of the invention is to provide a spin coating apparatus that provides a soft impact with low bubble density of liquid coating material on a wafer surface.

In accordance with the afore-mentioned objectives, there is provided a spin coating apparatus for applying a liquid material to a semiconductor wafer, or the like, that has a spin head for supporting a wafer on the top surface, a motor to rotate the spin head, and a nozzle located over the spin head for dispensing liquid on the wafer mounted on the spin head. A liquid well is provided having a bottom outlet opening, a bottom inlet opening, a top vent opening, and a heat exchange jacket on at least the well side walls. A shut-off valve is located between the nozzle and well, with the inlet of the valve communicating with the bottom outlet of the well, and the inlet of the valve communicating with the nozzle. A liquid supply source provides liquid to the well through the inlet opening of the well. A multi-stage vent and purge system is provided to vent and selectively introduce either gas or liquid cleaning medium into the well through the top vent opening. The distance between the nozzle and the spin head is controlled with a nozzle support means.

DESCRIPTION OF THE PREFERRED EMBODIMENTS

Various embodiments of the coating apparatus in accordance with the present invention will be described with reference to the accompanying drawings.

Figure 1:
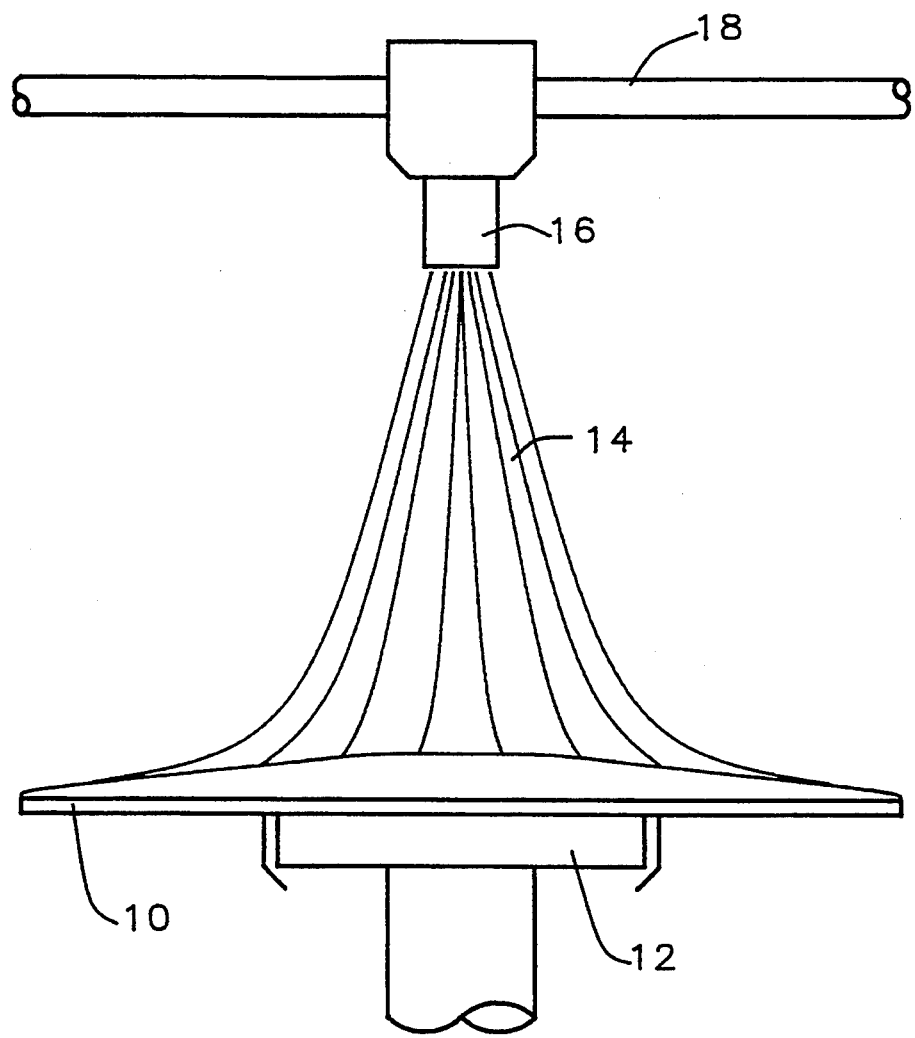
FIG. 1 is a schematic view of a typical spin-coating apparatus that is well known in the Prior Art.
Figure 2:
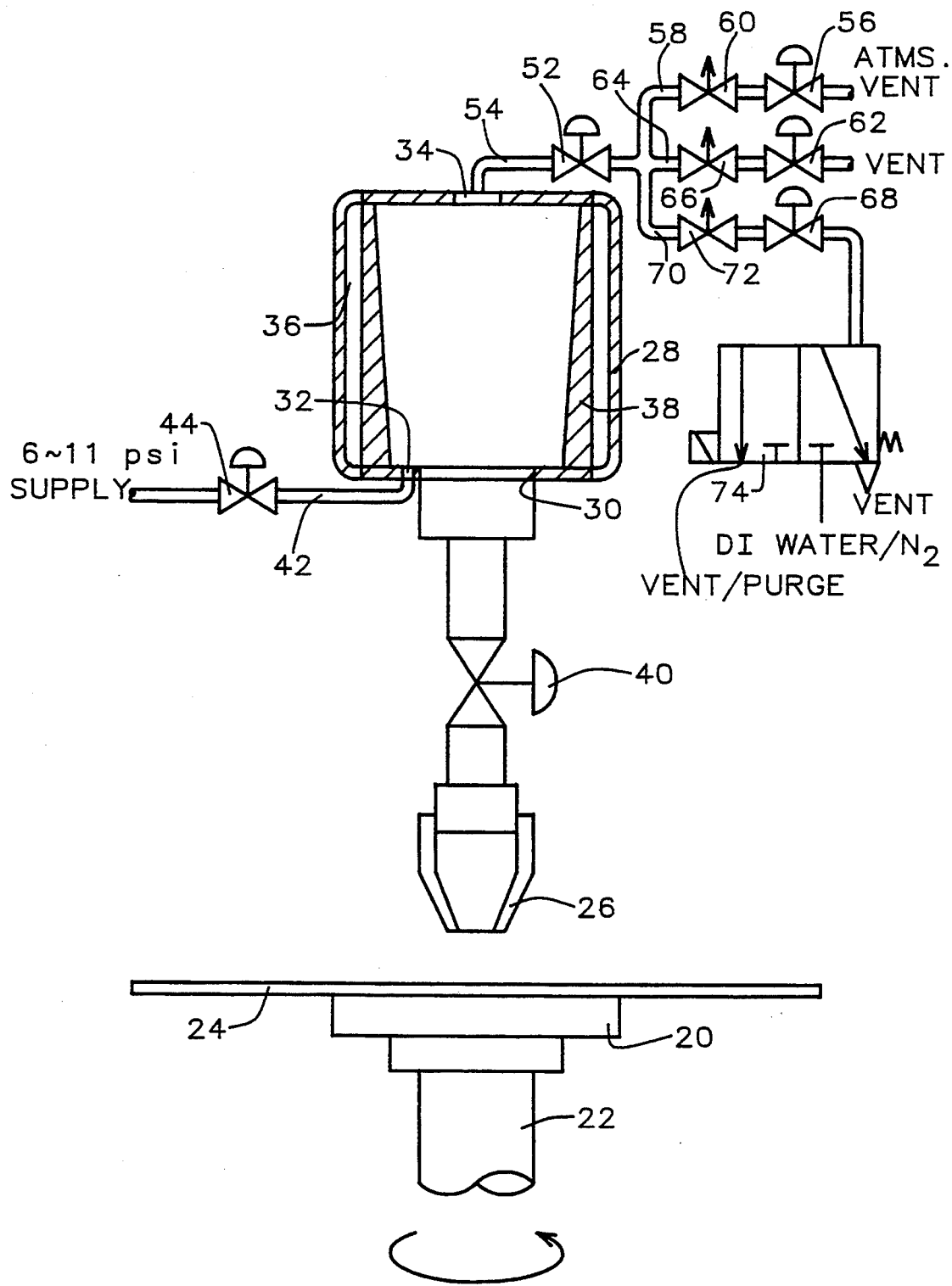
FIG. 2 is a schematic view of the essential elements of the coating apparatus of the invention.

Referring now to FIG. 2, there is depicted a first preferred embodiment of the invention. The coating apparatus has a conventional spin head 20 mounted for rotation about a vertical axis by spindle 22. A semiconductor wafer 24 is temporarily mounted on spin head 20, as is well known. A suitable motor, not shown, is provided to rotate the spindle at a suitable speed, normally in the range of 5 to 5000 revolutions per minute. Above the spin head 20, is provided a nozzle 26 for dispensing liquid, such a photoresist solution, developer solution, or the like, onto the wafer 24 as it is rotated.

The nozzle 26 tip is tapered to provide a laminar flow of the developer fluid. The preferred location of the nozzle is about 5 to 10 millimeters off-center as show in FIG. 3. FIG. 2 shows a centrally located to wafer nozzle.

A liquid well 28 is provided above the nozzle. The well 28 has a bottom outlet opening 30, a bottom inlet opening 32 to introduce liquids into the well, a top vent opening 34, and a heat exchange jacket 36 to maintain the liquid in the well at a suitable temperature. The temperature of the liquid will depend on the type of solution and the particular application. In general the temperature of a photoresist solution should be in the range of 20° to 24° C. depending on the wafer FAB cleanroom temperature. The temperature of a developer solution should be in the range of 22° to 23° C. The control of the developer fluid is very essential to the development process of photoresist. An intermediate developer wall 38 within well 28 is provided to facilitate a controlled temperature. Cooled and temperature controlled water is pumped through the wafer jacket between well 28 and well 38 to sustain a controlled temperature for the developer solution in the well 28. Since the developer performance decreases with increase in temperature as is well known. A thermocouple junction (not shown) is positioned at this location to monitor the temperature and to allow the temperature to be maintained at the desired number. Both wells can be formed of aluminum to enhance the heat transfer.

Mounted between nozzle 26 and well 28, is a conventional Teflon shut-off valve 40 in communication with the outlet opening 30 of well 28, and the inlet of nozzle 26. Valve 40 is activated by pneumatic signal generated from a 3-2 way solenoid valve which in turn is triggered from an electrical signal generated from an output port of some CPU or logic circuit.

Figure 4:
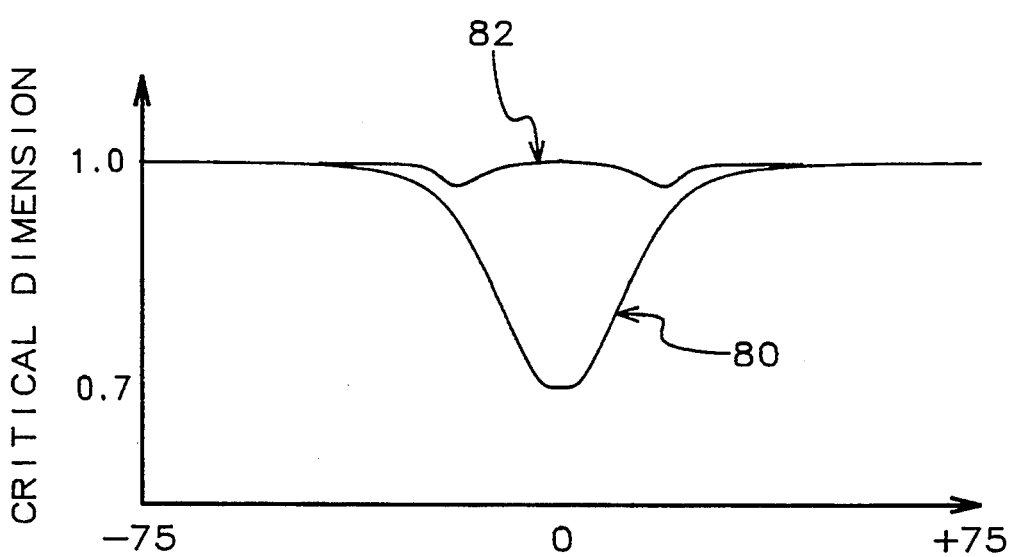
FIG. 4 is a graph showing the results of the Prior Art and the present novel method and apparatus after the developing process in terms of Critical Dimension (CD) versus wafer radius.
Figure 5:
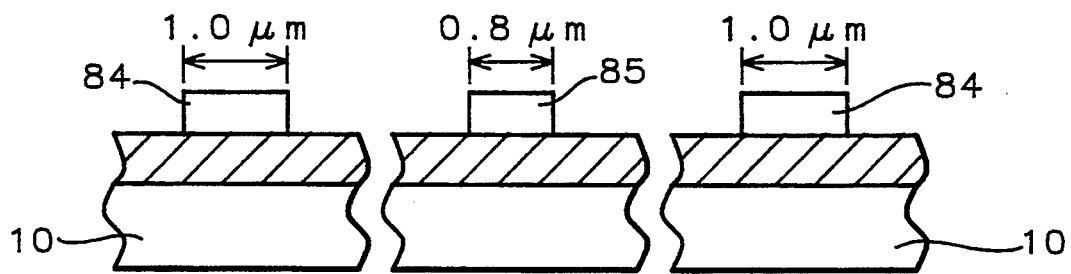
FIG. 5 is a schematic cross-sectional representation of the result of the Prior Art development of the photoresist mask and etching process using the Prior Art apparatus.

A liquid supply is connected to pipe 42 to introduce liquid into the bottom of well 28, through inlet opening 32. Preferably the liquid is introduced into the well at a pressure in the range of 6 to 11 psi. Valve 44 is provided to control the flow of liquid. This a critical feature of the invention. The well 28 avoids the direct dispense of developer solution, which could be in the range of 6 to 11 psi pressure head onto the wafer. This indirect dispense allows the dispense of developer solution at a controlled 1 to 3 psi. onto the wafer. This is a soft impact dispense which gives the excellent Critical Dimension (CD) curve 82 shown in FIG. 4.

The developer solution supply is connected to pipe 42 to introduce solution into the bottom of the well 28, through inlet opening 32. This solution pressure is usually at a range of 6 to 11 psi. depending upon the pump used to transfer the solution. Valve 44 is provided to control the flow of the liquid.

Figure 3:
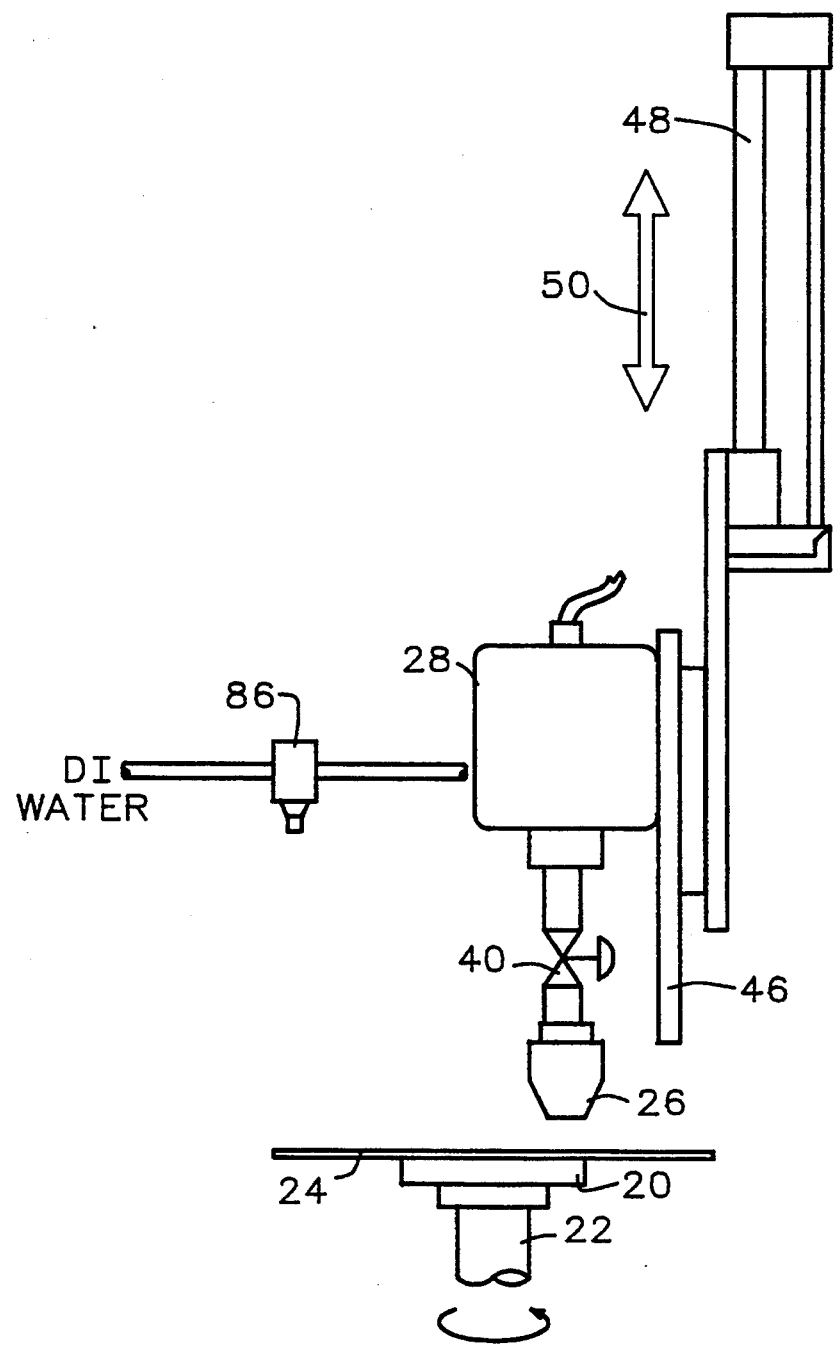
FIG. 3 is a front view of a preferred embodiment of the coating apparatus of the invention which shows other essential elements associated in the combination.

As more clearly shown in FIG. 3, nozzle 26, shut-off valve 40, and well 28 are preferably mounted as a unit on support 46. This unit is moved vertically into and out of position over wafer 24, by a suitable cylinder 48 or the like. Arrow 50 indicates the vertical movement provided by cylinder 48.

As shown in FIG. 2, a multi-stage vent and purge system is provided for venting and selectively introducing a gas or liquid cleaning medium into well 28 through vent opening 34. A master shut-off valve 52 in line 54 controls the entire vent and purge operation. A atmosphere valve 56 in line 58 and metering valve 60 permits venting of the well 28.

The operation of the system is as follows. When the dispense of the developer onto the wafer is not as yet needed, the valve 44 will open to allow the relatively high pressured developer (6 to 11 psi) into the well 28. The valve 40 will be closed while valves 52, 56 an 62 will be opened. Metering valves 60 and 66 allows the control of the rate of venting of the well 28 depending on the requirements of the process. Such requirements are, for example the cycle of development process which if it is a short process—then a high venting is needed to allow the well to fill up faster to cater to the short cycle of each wafer as developed. The duration of valve being open and allowing the developer solution to enter the well 28 can be controlled by a timer or another sensor (not shown) sensing the presence of the solution in line 54. When the well 28 is full, overflowing solution will travel in line 54. Sensor located therein could then trigger shut off valve 44 and valve 52.

In like manner, gas valve 62 in line 64, and metering valve 66 permits venting of well 28 of non-atmosphere gas, such as nitrogen, helium, etc.

Purge valve 68 in line 70, and check valve 72 permits introducing liquids such as de-ionization (DI) water, or inert gases into well 28, in combination with 3 way valve 74. The purge line 70 will be used after the well 28 has been emptied or almost total dispense of the developer solution onto the semiconductor wafer has occurred. There is residual developer solution left in the well 28. During rinsing cycle, valves 74, 68 will be activated to allow deionized (DI) water to flush out the remaining solution in the well 28. Nitrogen ($N_2$) purge can also be introduced after DI water purge to dry the nozzle 26 to prevent dripping.

The method of operation, which avoids the direct dispensing of developer solution at 6 to 11 psi. pressure head onto the wafer, uses techniques which allows a controlled dispensing pressure of between about 1 to 3 psi. and is as follows. The intermediate developer solution well 28 is filled by introducing the fluid into the bottom of the well so as to reduce the possible formation of bubbles at the normal supply pressure of 6 to 11 psi. The filling of the well is done when the nozzle 26 is in its uppermost position as indicated by arrow 50 in FIG. 3 and as controlled by means 48. The developer solution or fluid supply is connected to pipe 42 to introduce solution into the bottom of well 28 through inlet opening 32. Valve 40 will be closed while valves 52, 56 and 62 will be open. Metering valves 60, 66 allows the control of the rate of venting of well 28 depending on the requirements of, for example the cycle of developing process which if it is a short cycle process, then a high venting is needed to allow the well 28 to fill up faster to cater to the short cycle of each wafer being developed.

The duration of opening of valve 44 for filling of the well 28 can be controlled by timer or other sensor (not shown) sensing the presence of solution in line 54. When well 28 is full, overflowed solution will travel in line 54. The sensor located therein will then trigger the shut off of valve 44 and valve 52. With the well 28 full, it is preferred to allow the apparatus to sit as is for as long as possible to allow any bubbles in the well fluid to rise to the top.

A new wafer 24 is now moved onto the wafer rotating chuck 20 and under the well 28 and nozzle 26 while they are at their uppermost position. When the developer solution is called to be dispensed onto the wafer 24, the whole well 28 and nozzle 26 apparatus is moved down to just above the surface of the wafer 24 as seen in FIGS. 2 and 3. The critical height of the tip of the nozzle 26 above the wafer 24 is between about 5 to 15 millimeters. The nozzle is preferably off-center as seen in FIG. 3 by between about 5 to 10 millimeters.

As can now be seen best with reference to FIG. 2, the release of the developer solution or fluid onto the wafer 24 is done by opening valves 40 and 52 to line 54. Metering valve 60 can be preset to control the rate of venting. With this condition, the developer solution in well 28 will flow gently onto the wafer 24 at a controlled pressure of between about 1 to 3 psi. under this controlled venting. A close loop control is another possibility for enhanced performance. The features of the tapered well 28 and tapered nozzle 26 add to the gentle draining of the fluid by laminar flow through the valve 40. At the end of the dispensing step, the valve 40 is closed. The well 28 and nozzle 26 apparatus is raised to its uppermost position.

The photoresist on the wafer is developed while it is still on the wafer chuck 20 without spinning. This takes about 40 to 60 seconds. At the end of the timed process, the remaining developer fluid on the wafer is spun off of the wafer by spinning the chuck. The wafer is rinsed with DI water spray from DI water spray means 86. During this rinsing step, the valves 40 and 52 will open again along with 3–2 way solenoid valve 74 will trigger to allow the DI water to purge through lines 70 and 54 into well 28 and valve 40 hence cleaning the path. This prevents a long term clogging. If necessary, nitrogen can then be introduced through the same lines to dry these lines. The wafer 24 is now moved off the chuck 20 for further processing. The process now will repeat itself for a new wafer.

The advantages of the new apparatus and method for dispensing fluid upon a wafer include the provision of a soft impact fluid dispension which enhances the control of the resulting critical dimension across the wafer, the provision of a low bubble resist developer on the wafer and a cleaned in process nozzle.

While the invention has been particularly shown and described with reference to the preferred embodiments thereof, it will be understood by those skilled in the art, that various changes in form and details may be made without departing from the spirit and scope of the invention.

What is claimed is:

1. A method for dispensing a developer fluid onto a wafer having a resist coating to be developed supported on rotating chuck in a soft impact manner comprising:
   filling a developer well which is associated with a soft impact tapered nozzle by introducing the developer fluid into said well through an inlet located adjacent the bottom of said well so as to reduce the possible formation of bubbles at a normal pressure of between about 6 and 11 psi.;
   moving said wafer onto said chuck and under said soft impact nozzle;
   rotating said chuck;
   dispensing said developer fluid, while said chuck is rotating from said well through said nozzle onto the central area of said wafer under controlled pressure of less than 3 psi and in said soft impact manner;
   stopping the flow of said developer fluid;
   developing said resist on said wafer without rotating said chuck, while said wafer is on said chuck;
   removing unreacted developer fluid by rotating said chuck and by rinsing and drying said resist; and
   removing said wafer from said chuck.

2. The method of claim 1 wherein said well and said nozzle are cleaned and rinsed of developer fluid with the liquid which does the cleaning and rinsing at the same time as said rinsing and drying with said liquid flowing onto said wafer.

3. The method of claim 1 wherein a shut-off valve for dispensing said developer fluid and said well are mounted directly above said nozzle.

4. The method of claim 1 wherein an inlet line is provided to said well that enters the well through said inlet located on the bottom of said well so as to reduce bubble formation in said well.

5. The method of claim 1 wherein the distance between said nozzle and said wafer is between about 5 to 15 millimeters for applying said developer to said wafer at soft impact.

6. The method of claim 1 wherein said developer fluid is dispensed from the nozzle spaced off-center from the center of said wafer, a distance in the range of 5 to 10 millimeters.

7. A method for developing a resist on a wafer surface in a controlled and uniform manner across the wafer comprising:
   filling an intermediate developer well which is associated with and directly above a soft impact tapered nozzle by introducing the developer fluid into the bottom of said well so as to reduce the possible formation of bubbles at a normal pressure of between about 6 and 11 psi.;
   moving said wafer having a resist coating thereon onto a rotatable chuck and directly under said soft tapered impact nozzle;
   rotating said chuck;
   dispensing said developer fluid, while said chuck is rotating, from said intermediate well through said nozzle located beneath said well onto the central area of said wafer under controlled and said soft impact manner at a controlled pressure of less than about 3 psi.;
   stopping the flow of said developer fluid;
   developing said resist on said wafer without rotating said chuck, while said wafer is on said chuck;
   removing unreacted developer fluid by rotating said chuck and by spraying a cleaning liquid at said wafer for rinsing said developer from said wafer and simultaneously rinsing said developer from said well and nozzle onto said wafer; and
   removing said wafer from said chuck.

8. The method of claim 7 wherein said distance between said wafer and nozzle is between about 5 to 15 millimeters for applying said developer to said wafer at soft impact.

* * * * *